(12) United States Patent
Shimazaki

(10) Patent No.: US 11,804,425 B2
(45) Date of Patent: *Oct. 31, 2023

(54) ELECTRONIC DEVICE AND WIRING BOARD

(71) Applicant: LAPIS SEMICONDUCTOR CO., LTD.

(72) Inventor: Koya Shimazaki, Kanagawa (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 242 days.

This patent is subject to a terminal disclaimer.

(21) Appl. No.: 17/458,703

(22) Filed: Aug. 27, 2021

(65) Prior Publication Data

US 2021/0391241 A1 Dec. 16, 2021

Related U.S. Application Data

(63) Continuation of application No. 16/389,702, filed on Apr. 19, 2019, now Pat. No. 11,133,243.

(30) Foreign Application Priority Data

Apr. 27, 2018 (JP) .................................. 2018-087671

(51) Int. Cl.
*H01L 23/552* (2006.01)
*H01L 23/498* (2006.01)

(52) U.S. Cl.
CPC .. *H01L 23/49811* (2013.01); *H01L 23/49838* (2013.01); *H01L 23/552* (2013.01); *H01L 2924/3025* (2013.01)

(58) Field of Classification Search
CPC ...................................................... H01L 23/552
See application file for complete search history.

(56) References Cited

U.S. PATENT DOCUMENTS 5,847,451 A * 12/1998 Ohtaki ................ H05K 1/0233
257/697
2002/0145180 A1 10/2002 Terui et al.
2007/0200218 A1 8/2007 Mukaibara

FOREIGN PATENT DOCUMENTS

JP H09-326451 A 12/1997

* cited by examiner

*Primary Examiner* — Moazzam Hossain
*Assistant Examiner* — Hajar Kolahdouzan
(74) *Attorney, Agent, or Firm* — Volentine, Whitt & Francos, PLLC

(57) ABSTRACT

An electronic device including: a semiconductor device including plural terminals input with voltages having a same potential; and a wiring board including a mounting region at which the semiconductor device is mounted, wherein the wiring board includes a board wiring line formed on the wiring board from a connection portion at which one terminal of the plural terminals is connected, via an inside of the mounting region, to a connection portion at which another terminal of the plural terminals is connected.

4 Claims, 19 Drawing Sheets

ELECTRONIC DEVICE AND WIRING BOARD

CROSS-REFERENCE TO RELATED APPLICATION

This application is a continuation application of application Ser. No. 16/389,702 filed on Apr. 19, 2019, which application claims priority under 35 USC 119 from Japanese Patent Application No. 2018-087671, filed on Apr. 27, 2018, the disclosure of which is incorporated by reference herein.

BACKGROUND

Technical Field

The present disclosure relates to an electronic device and a wiring board.

Related Art

The following technology is known as technology related to countermeasures to noise for an electronic device including a semiconductor device with a packaged semiconductor chip and a wiring board that the semiconductor device is mounted on.

For example, in Japanese Patent Application Laid-Open (JP-A) No. H9-326451 a multilayer printed wiring board for mounting an LSI including plural power supply pins and plural signal pins is disclosed. The multilayer printed wiring board is configured such that some or all of the plural power supply pins are connected to a power supply pattern via an inductance pattern.

In a semiconductor device with a packaged semiconductor chip, sometimes there are plural power supply terminals each applied with a voltage at the same potential to each other in order to make a power supply more robust. A semiconductor device including plural power supply terminals may include a conduction path extending from one out of the plural power supply terminals to another of the plural power supply terminals via one lead-wire, a chip internal wiring line formed inside a semiconductor chip, and another lead-wire. A wiring board mounted with a semiconductor device including such a conduction path may include a board wiring line formed on the wiring board for connecting the plural power supply terminals to each other. In order to improve the tolerance to incident external noise, a ground pattern is sometimes provided on the wiring board so as to cover a mounting region at which the semiconductor device is mounted. In a case in which such a ground pattern is provided to the mounting region for mounting the semiconductor device, the board wiring line that connects the plural power supply terminals to each other is arranged so as to bypass the mounting region for mounting the semiconductor device. In such cases, a conduction loop may be formed by the conduction path formed inside the semiconductor device, and the board wiring line connecting the plural power supply terminals to each other, and this might lower the tolerance to incident external electromagnetic noise. For example, a power supply voltage fluctuates due to electromagnetic inductance in a case in which there is a change in a magnetic flux passing through the inside of the conduction loop. This may lead to unstable circuit operation or to circuit elements being damaged.

SUMMARY

The present disclosure provides an electronic device and a wiring board that may improve tolerance to incident external electromagnetic noise.

A first aspect of the present disclosure is an electronic device including: a semiconductor device including plural terminals input with voltages having a same potential; and a wiring board including a mounting region at which the semiconductor device is mounted, wherein the wiring board includes a board wiring line formed on the wiring board from a connection portion at which one terminal of the plural terminals is connected, via an inside of the mounting region, to a connection portion at which another terminal of the plural terminals is connected.

A second aspect of the present disclosure is a wiring board including: a mounting region for mounting a semiconductor device that includes plural terminals input with voltages having a same potential; and a board wiring line formed on the wiring board from a connection portion at which one terminal of the plural terminals is connected, via an inside of the mounting region, to a connection portion at which another terminal of the plural terminals is connected.

The above aspects of the present disclosure enable provision of an electronic device and a wiring board that may improve tolerance to incident external electromagnetic noise.

BRIEF DESCRIPTION OF THE DRAWINGS

Exemplary embodiments will be described in detail based on the following figures, wherein.

DETAILED DESCRIPTION

Figure 1A:
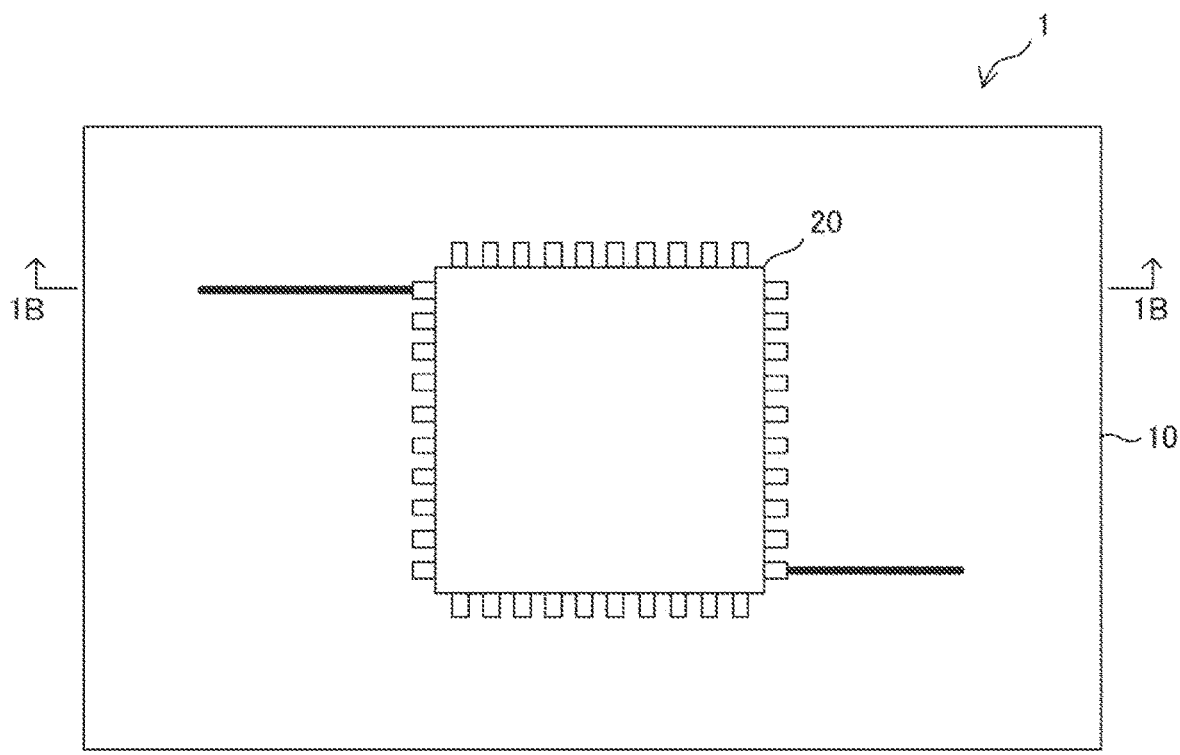
FIG. 1A is a plan view illustrating a schematic configuration of an electronic device 1 according to a first exemplary embodiment of the present disclosure.

Explanation follows regarding exemplary embodiments of technology disclosed herein, with reference to the drawings. Note that the same reference numerals are appended in each of the drawings to the same or equivalent configuration elements and parts.

First Exemplary Embodiment

Figure 1B:
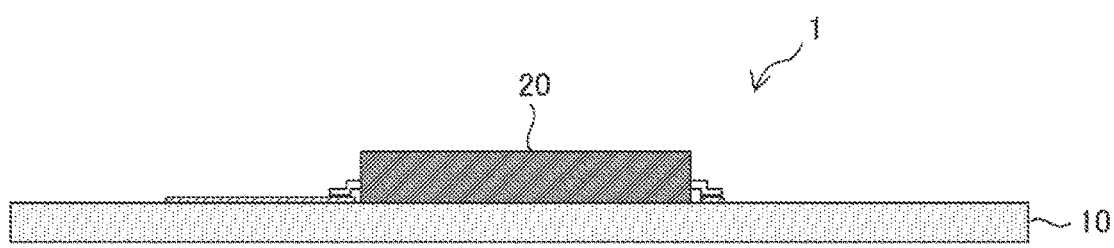
FIG. 1B is a cross-section taken along line 1B-1B in FIG. 1A.

FIG. 1A is a plan view illustrating an example of a schematic configuration of an electronic device 1 according to a first exemplary embodiment of the present disclosure. FIG. 1B is a cross-section taken along line 1B-1B in FIG. 1A. The electronic device 1 is configured including a wiring board 10, and a semiconductor device 20 mounted on the wiring board 10.

Figure 2:
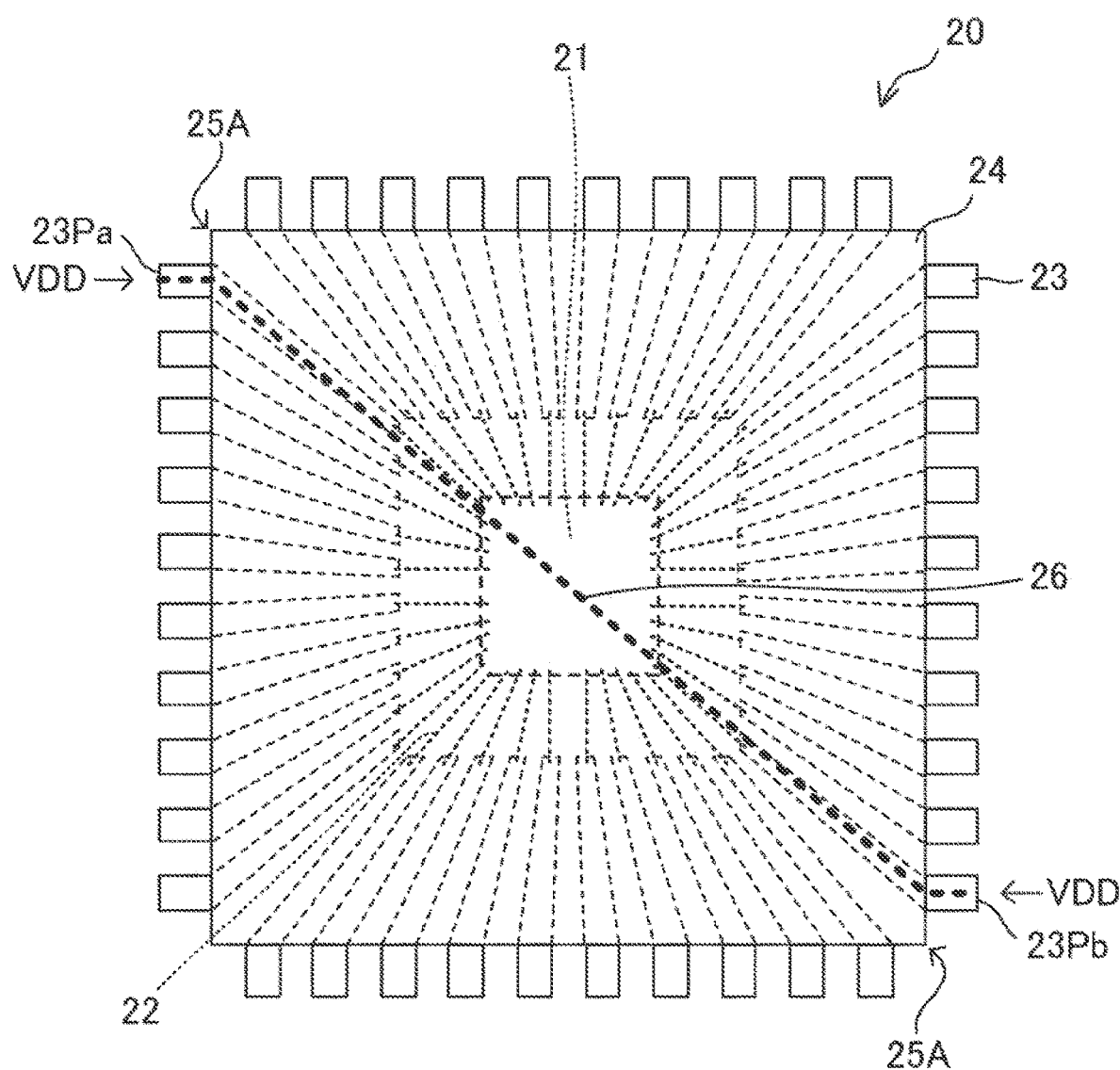
FIG. 2 is a plan view illustrating an internal structure of a semiconductor device according to an exemplary embodiment of the present disclosure.

FIG. 2 is a plan view illustrating an example of an internal structure of the semiconductor device 20. The semiconductor device 20 is configured including a semiconductor chip 21 formed with an integrated circuit, plural terminals 23 connected to the semiconductor chip 21 via lead-wires 22, and a sealing member 24 to seal the semiconductor chip 21. The external profile of the semiconductor device 20 in the present exemplary embodiment is substantially rectangular when viewed in plan view. The semiconductor device 20 may, for example, have a packaged state of a quad flat package (QFP).

In the present exemplary embodiment the plural terminals 23 include two power supply terminals 23Pa and 23Pb each applied with a power supply voltage VDD with the same potential to each other. The power supply terminal 23Pa is arranged at the vicinity of a corner 25A of the semiconductor device 20, and is connected to the semiconductor chip 21 via a lead-wire 22. The power supply terminal 23Pb is arranged at the vicinity of a corner 25B diagonally opposite the corner 25A on the semiconductor device 20, and is connected via a lead-wire 22 to a different semiconductor chip location to the location at which the power supply terminal 23Pa is connected. Due to the semiconductor device 20 including the plural power supply terminals 23Pa and 23Pb, the in-plane uniformity of the power supply voltage of the semiconductor chip 21 may be raised.

The semiconductor device 20 includes a conduction path 26 extending to the power supply terminal 23Pb via the power supply terminal 23Pa, one of the lead-wires 22, a chip internal wiring line (not illustrated in the drawings) formed inside the semiconductor chip 21, and another of the lead-wires 22. Note that the portion of the conduction path 26 passing through the inside of the semiconductor chip 21 need not necessarily always have a straight line shape as illustrated in the example in FIG. 2, and may be bent.

Figure 3:
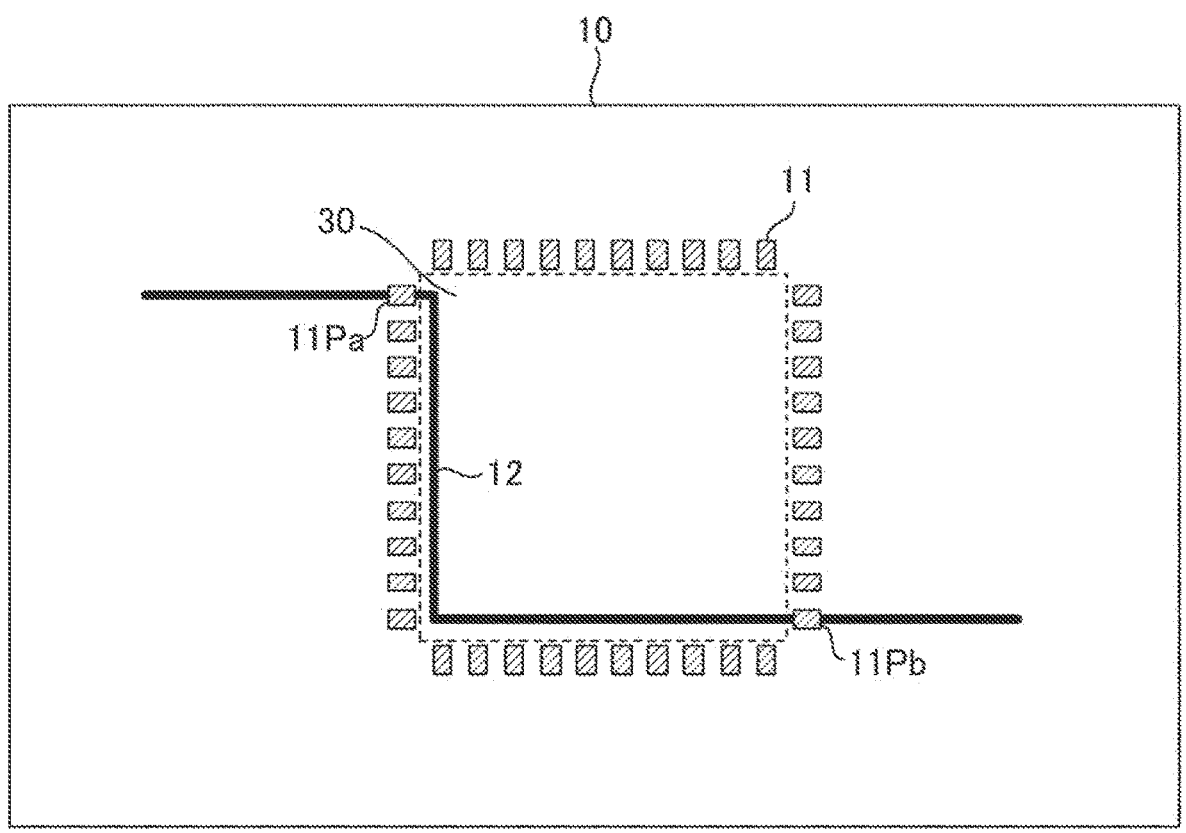
FIG. 3 is a plan view illustrating a wiring pattern formed on the wiring board according to an exemplary embodiment of the present disclosure.

FIG. 3 is a plan view illustrating an example of a wiring pattern formed on the wiring board 10. The wiring board 10 includes plural lands 11 serving as connection portions at which the plural terminals 23 of the semiconductor device 20 are connected. The plural lands 11 include a land 11Pa that the power supply terminal 23Pa is connected to, and a land 11Pb that the power supply terminal 23Pb is connected to. The wiring board 10 includes a board wiring line 12 that passes over the land 11Pa, inside a mounting region 30, and over the land 11Pb. The lands 11Pa and 11Pb are thereby connected to each other by the board wiring line 12, enabling the power supply voltage VDD of the same potential to be respectively supplied to the power supply terminals 23Pa and 23Pb of the semiconductor device 20.

Figure 4A:
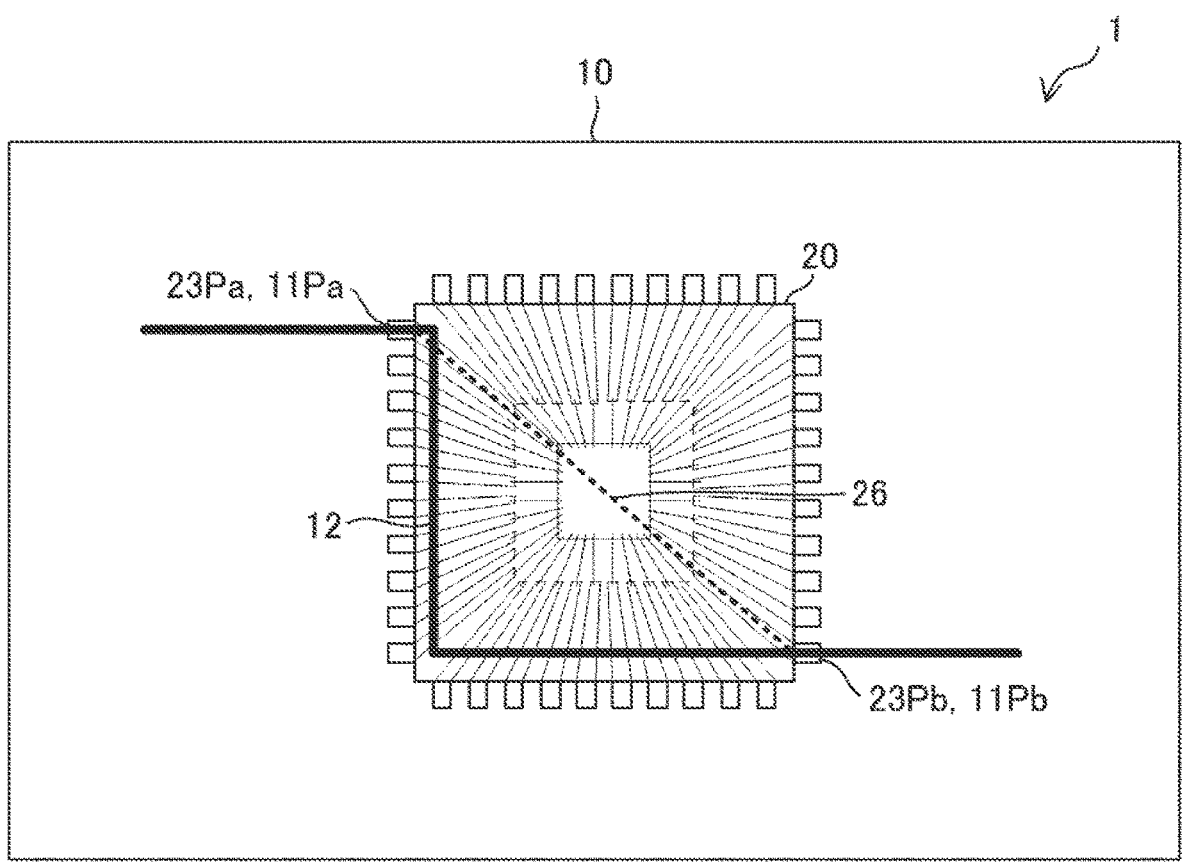
FIG. 4A is a plan view illustrating an internal structure of a semiconductor device according to an exemplary embodiment of the present disclosure, with a conduction path formed in the semiconductor device illustrated in combination with a board wiring line formed on the wiring board.
Figure 4B:
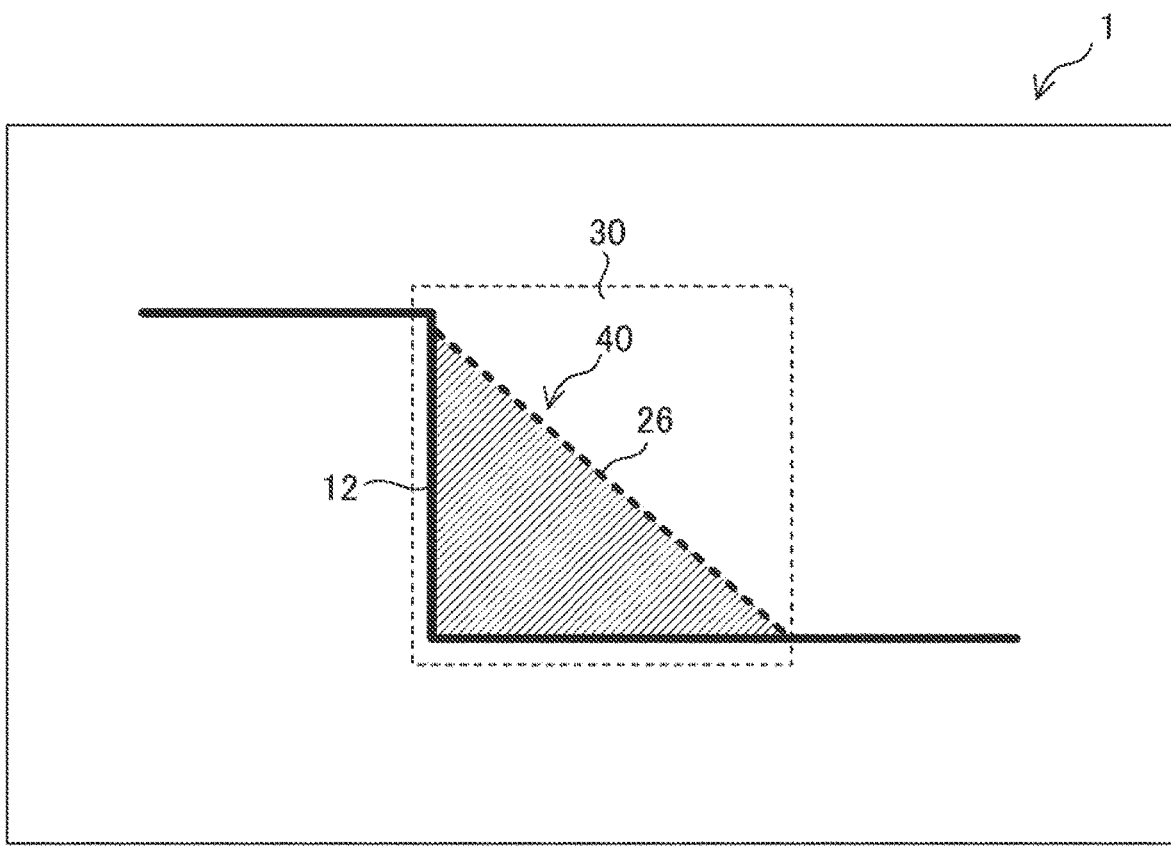
FIG. 4B is a plan view illustrating the conduction path and the board wiring line extracted from the elements illustrated in FIG. 4A.

FIG. 4A is a plan view illustrating an internal structure of the semiconductor device 20, with the conduction path 26 formed in the semiconductor device 20 illustrated in combination with the board wiring line 12 formed on the wiring board 10. FIG. 4B is a plan view illustrating the conduction path 26 and the board wiring line 12 extracted from the elements illustrated in FIG. 4A. In the electronic device 1 according to the present exemplary embodiment, the conduction path 26 formed in the semiconductor device 20 is electrically connected to the board wiring line 12 formed on the wiring board 10, and a conduction loop 40 is configured thereby. There is a concern that the conduction loop 40 might act as a loop antenna, with magnetic flux passing through the inside of the conduction loop 40 changing due to incident external electromagnetic noise. The potential of the conduction path 26 and the board wiring line 12 (namely, the potential of the power supply voltage VDD) would then fluctuate due to electromagnetic inductance. The surface area of the inside region of the conduction loop 40 (the region indicated by hatching in FIG. 4B) is accordingly preferably as small as possible in order to suppress such fluctuations in potential.

Figure 5A:
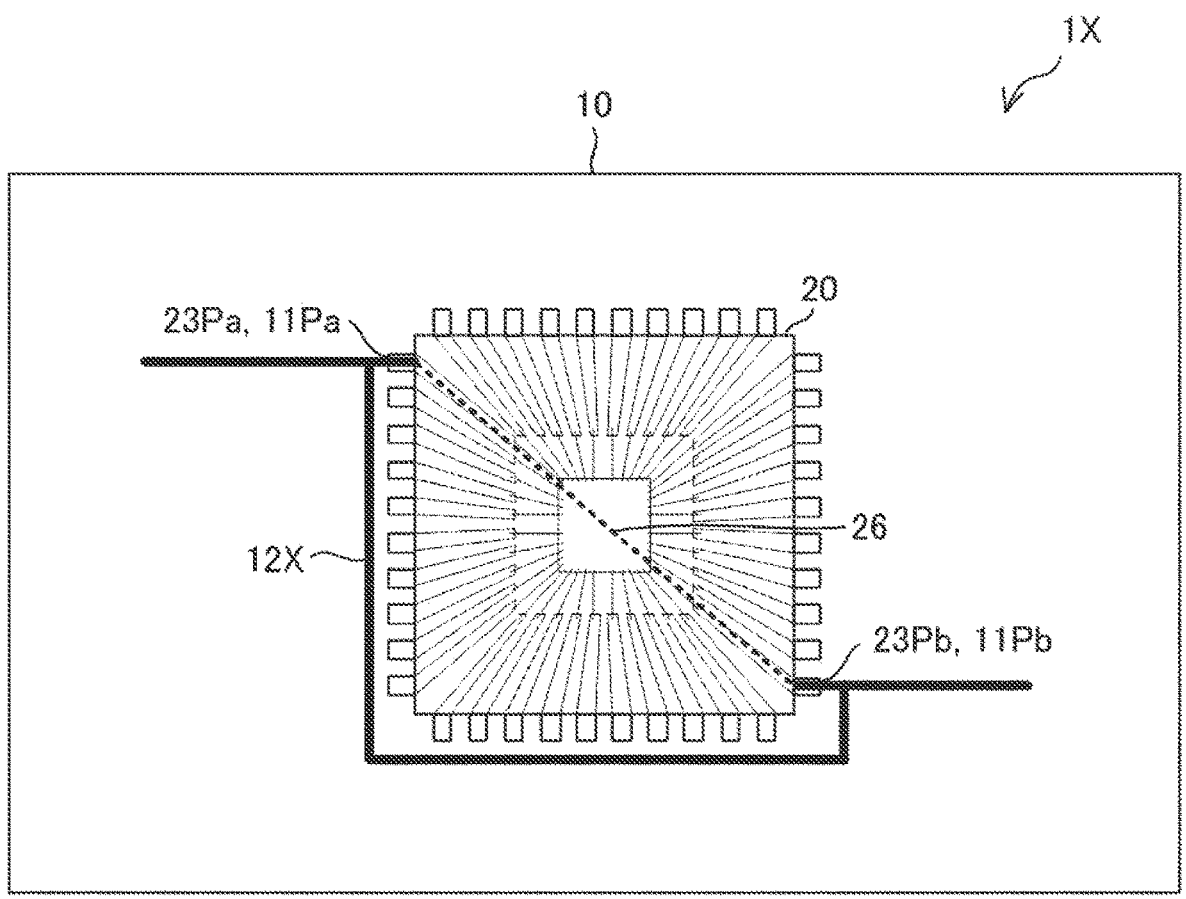
FIG. 5A is a plan view illustrating a configuration of an electronic device according to a comparative example.
Figure 5B:
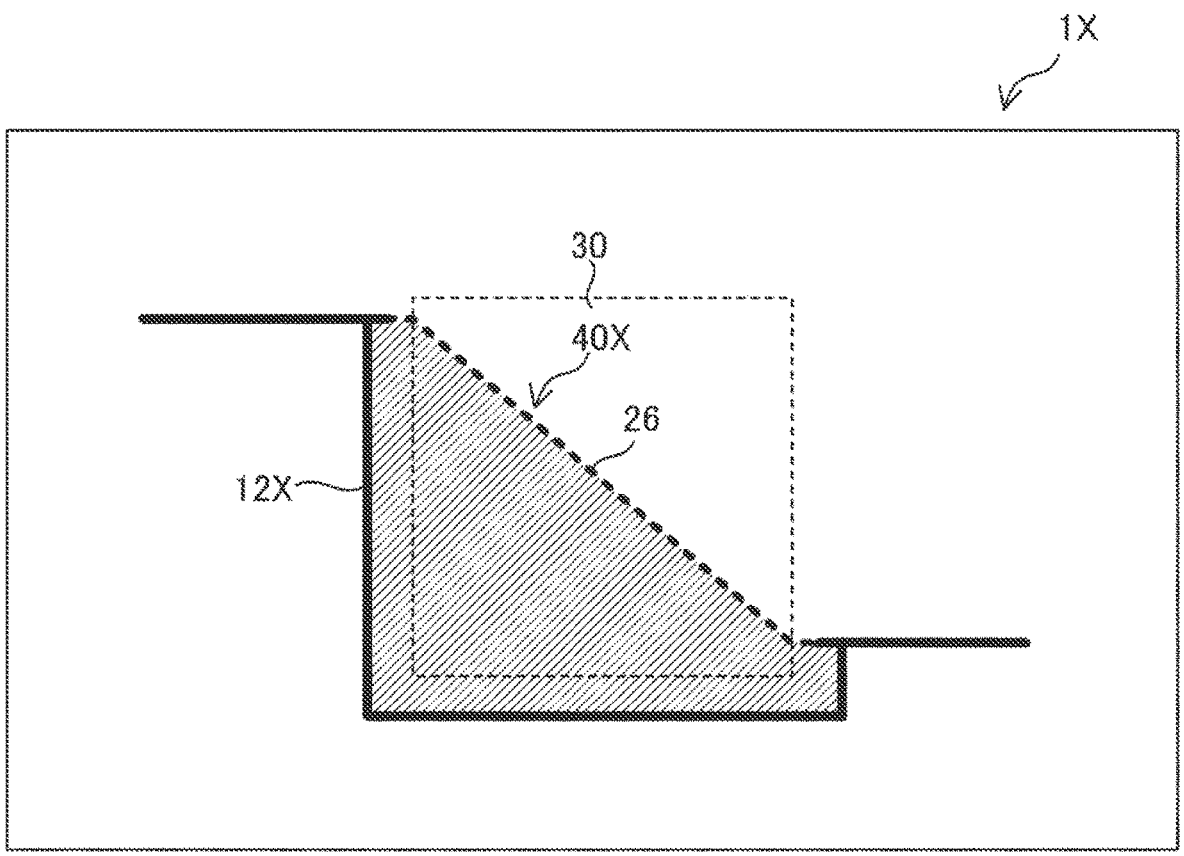
FIG. 5B is a plan view illustrating the conduction path and the board wiring line extracted from the elements illustrated in FIG. 5A.

FIG. 5A is a plan view illustrating an example of a configuration of an electronic device 1X according to a comparative example. The internal structure of the semiconductor device 20 is illustrated in FIG. 5A, with the conduction path 26 formed in the semiconductor device 20 illustrated in combination with a board wiring line 12X formed on the wiring board 10. FIG. 5B is a plan view illustrating the conduction path 26 and the board wiring line 12X extracted from the elements illustrated in FIG. 5A. In the electronic device 1X according to the comparative example, the routing of the board wiring line 12X differs from that of the board wiring line 12 according to the exemplary embodiment of the present disclosure. Namely, the board wiring line 12X according to the comparative example extends from the land 11Pa at which the power supply terminal 23Pa is connected, via the outside of the mounting region 30, to the land 11Pb at which the power supply terminal 23Pb is connected.

In the electronic device 1X according to the comparative example, a portion of the board wiring line 12X from the land 11Pa to the land 11Pb passes around the outside of the mounting region 30 for the semiconductor device 20. This means that the surface area of the inside region of a conduction loop 40X configured by the conduction path 26 formed in the semiconductor device 20 and the board wiring line 12X (the region illustrated by hatching in FIG. 5B) is larger than that of the conduction loop 40 according to the exemplary embodiment of the present disclosure.

However, in the electronic device 1 according to the exemplary embodiment of the present disclosure, a portion of the board wiring line 12 from the land 11Pa to the land 11Pb passes through the inside of the mounting region 30 for the semiconductor device 20. This thereby enables the surface area of the inside region of a conduction loop 40 to be smaller than that of the conduction loop 40X according to the comparative example. The electronic device 1 according to the exemplary embodiment of the present disclosure accordingly enables the tolerance to incident external electromagnetic noise to be improved in comparison to that of the electronic device 1X according to the comparative example. Note that the surface area of the inside region of the conduction loop 40 is preferably not more than half (50%) of the surface area of the mounting region 30 for the semiconductor device 20.

Furthermore, in the electronic device 1 according to the exemplary embodiment of the present disclosure, a portion of the board wiring line 12 passing through inside the mounting region 30 is covered by the lead-wires 22 and the terminals 23 of the semiconductor device 20. The lead-wires 22 and the terminals 23 function as a shield to electromagnetic noise. This may further improve the tolerance to electromagnetic noise, due to the portion of the board wiring line 12 passing through the inside of the mounting region 30 being covered by the lead-wires 22 and the terminals 23.

Moreover, since the electronic device 1 according to the exemplary embodiment of the present disclosure reduces the effect of electromagnetic noise, the tolerance to electromagnetic noise may be improved without mounting electromagnetic noise countermeasure components such as capacitors. Accordingly, the fabrication cost may be suppressed in comparison to electronic devices mounted with electromagnetic noise countermeasure components.

Second Exemplary Embodiment

Figure 6A:
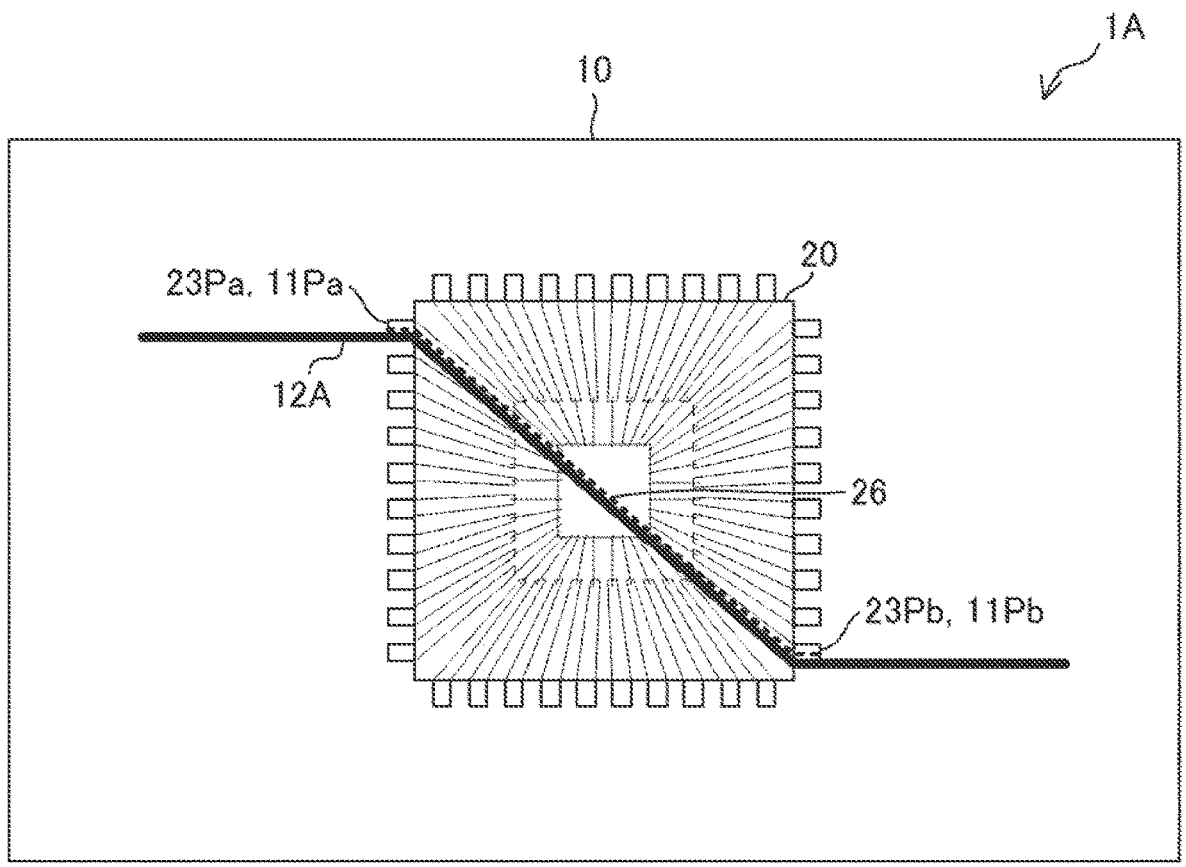
FIG. 6A is a plan view illustrating a configuration of an electronic device according to a second exemplary embodiment of the present disclosure.
Figure 6B:
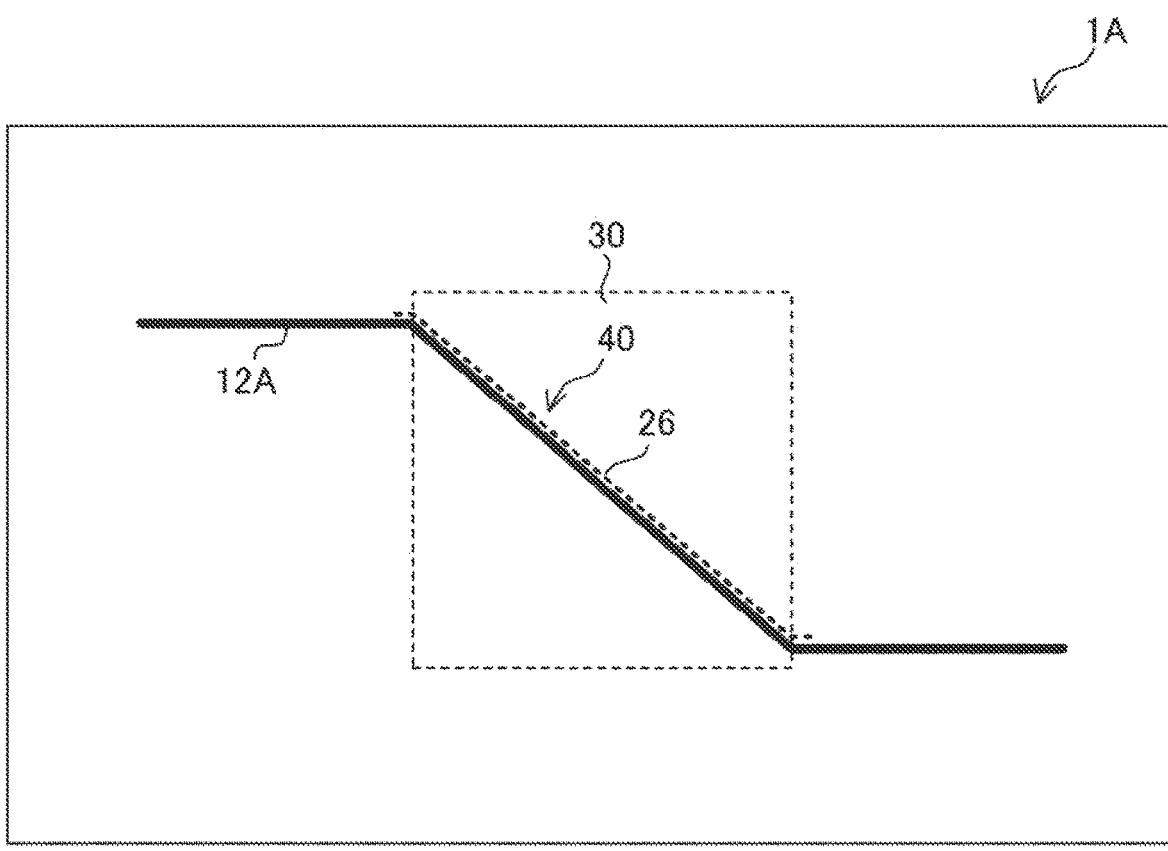
FIG. 6B is a plan view illustrating the conduction path and the board wiring line extracted from the elements illustrated in FIG. 6A.

FIG. 6A is a plan view illustrating an example of a configuration of an electronic device 1A according to a second exemplary embodiment of the present disclosure. The internal structure of a semiconductor device 20 is illustrated in FIG. 6A, with a conduction path 26 formed in the semiconductor device 20 illustrated in combination with a board wiring line 12A formed to a wiring board 10. FIG. 6B is a plan view illustrating the conduction path 26 and the board wiring line 12A extracted from the elements illustrated in FIG. 6A.

the electronic device 1A according to the second exemplary embodiment of the present disclosure, the routing of the board wiring line 12A differs from that of the board wiring line 12 according to the first exemplary embodiment. The board wiring line 12A according to the second exemplary embodiment extends from a land 11Pa at which a power supply terminal 23Pa is connected, via the inside of the mounting region 30 for the semiconductor device 20, to a land 11Pb at which a power supply terminal 23Pb is connected. The portion of the board wiring line 12A passing through the inside of the mounting region 30 is arranged along the conduction path 26 formed in the semiconductor device 20. More specifically, a portion of the board wiring line 12A passing through the inside of the mounting region 30 is arranged directly below the conduction path 26 so as to be in superposition with the conduction path 26.

The electronic device 1A according to the second exemplary embodiment of the present disclosure may enable the surface area of the inside region of the conduction loop 40 configured by the conduction path 26 formed in the semiconductor device 20 and the board wiring line 12A formed on the wiring board 10, to be essentially zero. Accordingly, the magnetic flux passing through the inside of the conduction loop 40 may be made essentially zero, and may further improve tolerance to electromagnetic noise.

Third Exemplary Embodiment

Figure 7A:
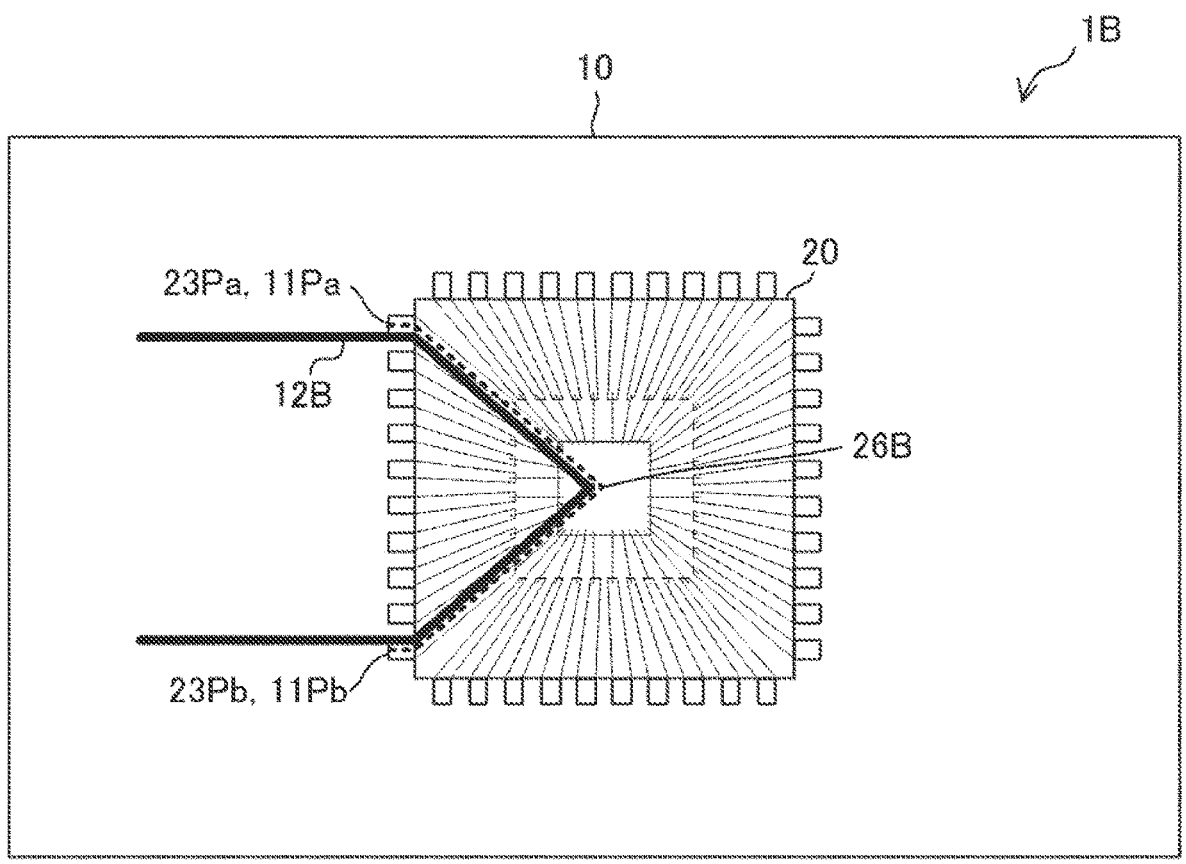
FIG. 7A is a plan view illustrating a configuration of an electronic device according to a third exemplary embodiment of the present disclosure.
Figure 7B:
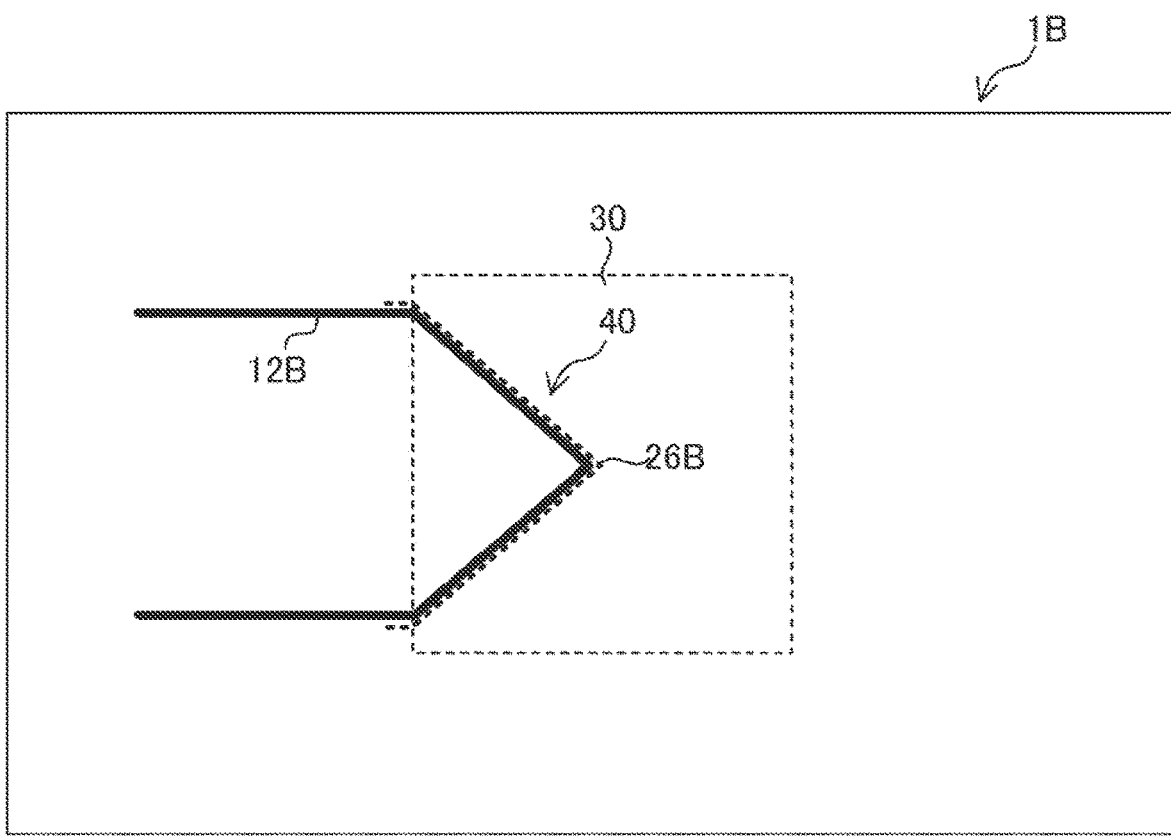
FIG. 7B is a plan view illustrating the conduction path and the board wiring line extracted from the elements illustrated in FIG. 7A.

FIG. 7A is a plan view illustrating an example of a configuration of an electronic device 1B according to a third exemplary embodiment of the present disclosure. The internal structure of a semiconductor device 20 is illustrated in FIG. 7A, with a conduction path 26B formed in the semiconductor device 20 illustrated in combination with a board wiring line 12B formed to a wiring board 10. FIG. 7B is a plan view illustrating the conduction path 26B and the board wiring line 12B extracted from the elements illustrated in FIG. 7A.

In an electronic device 1B according to the third exemplary embodiment of the present disclosure, a power supply terminal 23Pa and a power supply terminal 23Pb of the semiconductor device 20 are provided at one edge of the semiconductor device 20. The conduction path 26B is accordingly bent, as illustrated in FIG. 7A and FIG. 7B, and extends to the power supply terminal 23Pb via the power supply terminal 23Pa, a lead-wire 22, a chip internal wiring line (not illustrated in the drawings) formed inside the semiconductor chip 21, and another lead-wire 22.

The board wiring line 12B extends from a land 11Pa at which the power supply terminal 23Pa is connected, via the inside of a mounting region 30 for the semiconductor device 20, to the land 11Pb at which the power supply terminal 23Pb is connected. The portion of the board wiring line 12B passing through the inside of the mounting region 30 is arranged along the conduction path 26B formed in the semiconductor device 20. More specifically, a portion of the board wiring line 12B passing through the inside of the mounting region 30 is arranged directly below the conduction path 26B so as to be in superposition with the conduction path 26B.

The electronic device 1B according to the third exemplary embodiment of the present disclosure may enable the surface area of an inside region of a conduction loop 40 configured by the conduction path 26B formed in the semiconductor device 20 and the board wiring line 12B formed on the wiring board 10 to be essentially zero. Accordingly, the magnetic flux passing through the inside of the conduction loop 40 may be made essentially zero, and my further improve the tolerance to electromagnetic noise.

Fourth Exemplary Embodiment

Figure 8A:
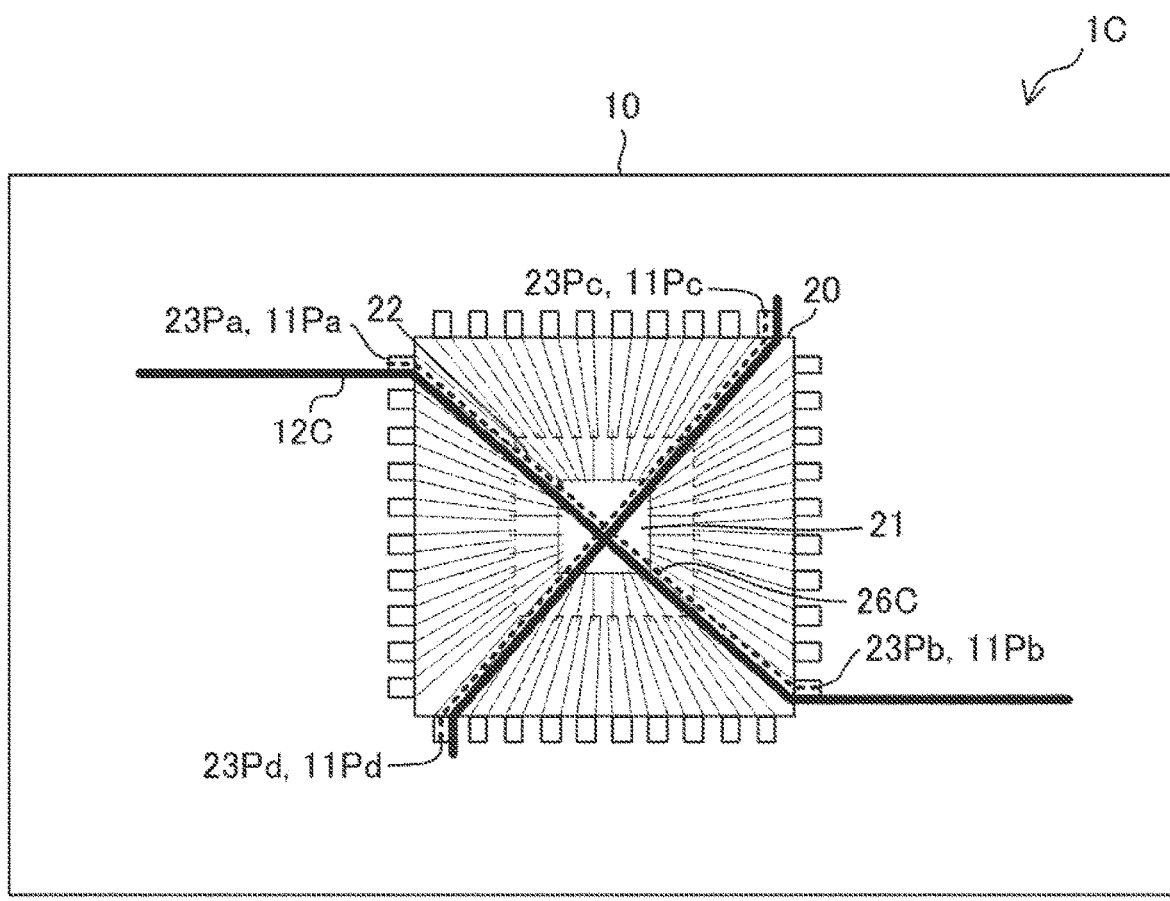
FIG. 8A is a plan view illustrating a configuration of an electronic device according to a fourth exemplary embodiment of the present disclosure.
Figure 8B:
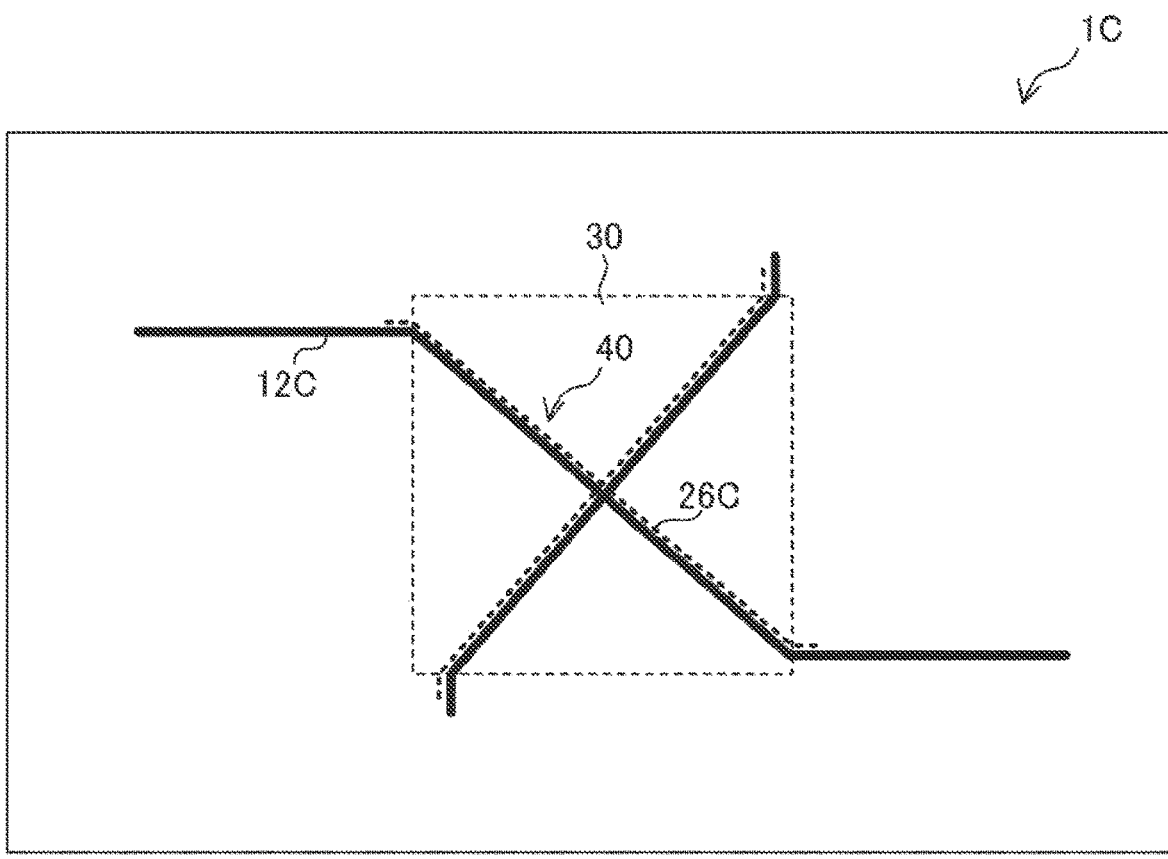
FIG. 8B is a plan view illustrating the conduction path and the board wiring line extracted from the elements illustrated in FIG. 8A.

FIG. 8A is a plan view illustrating an example of a configuration of an electronic device 1C according to a fourth exemplary embodiment of the present disclosure. The internal structure of the semiconductor device 20 is illustrated in FIG. 8A, with a conduction path 26C formed in the semiconductor device 20 illustrated in combination with a board wiring line 12C formed on a wiring board 10. FIG. 8B is a plan view illustrating the conduction path 26C and the board wiring line 12C extracted from the elements illustrated in FIG. 8A.

The semiconductor device 20 according to the fourth exemplary embodiment of the present disclosure includes four power supply terminals 23Pa, 23Pb, 23Pc, 23Pd each applied with a power supply voltage VDD of the same potential to each other. The power supply terminals 23Pa, 23Pb, 23Pc, 23Pd are each respectively arranged in the vicinity of each corner of the semiconductor device 20. The semiconductor device 20 includes the conduction path 26C to connect the power supply terminals 23Pa, 23Pb, 23Pc, 23Pd to each other. The conduction path 26C is configured including lead-wires 22 and a chip internal wiring line (not illustrated in the drawings) formed inside the semiconductor chip 21.

The wiring board 10 includes a land 11Pa at which the power supply terminal 23Pa is connected, a land 11Pb at which the power supply terminal 23Pb is connected, a land 11Pc at which a power supply terminal 23Pc is connected, and a land 11Pd at which the power supply terminal 23Pd is connected. The wiring board 10 includes the board wiring line 12C extending from the land 11Pa, via the inside of a mounting region 30 for the semiconductor device 20, to the other lands 11Pb, 11Pc, 11PD. The lands 11Pa, 11Pb, 11Pc, 11Pd being connected to each other by the board wiring line 12C in this manner enables a power supply voltage VDD of the same potential to be respectively supplied to the power supply terminals 23Pa, 23Pb, 23Pc, 23Pd of the semiconductor device 20.

The portion of the board wiring line 12C passing through the inside of the mounting region 30 is arranged along the conduction path 26C formed in the semiconductor device 20. More specifically, a portion of the board wiring line 12C passing through the inside of the mounting region 30 is arranged directly below the conduction path 26C so as to be in superposition with the conduction path 26C.

The electronic device 1C according to the fourth exemplary embodiment of the present disclosure may enable the surface area of the inside region of a conduction loop 40 configured by the conduction path 26C formed in the semiconductor device 20 and the board wiring line 12C formed on the wiring board 10 to be essentially zero. Accordingly, the magnetic flux passing through the inside of the conduction loop 40 may be made essentially zero, and may further improve the tolerance to electromagnetic noise.

Fifth Exemplary Embodiment

Figure 9A:
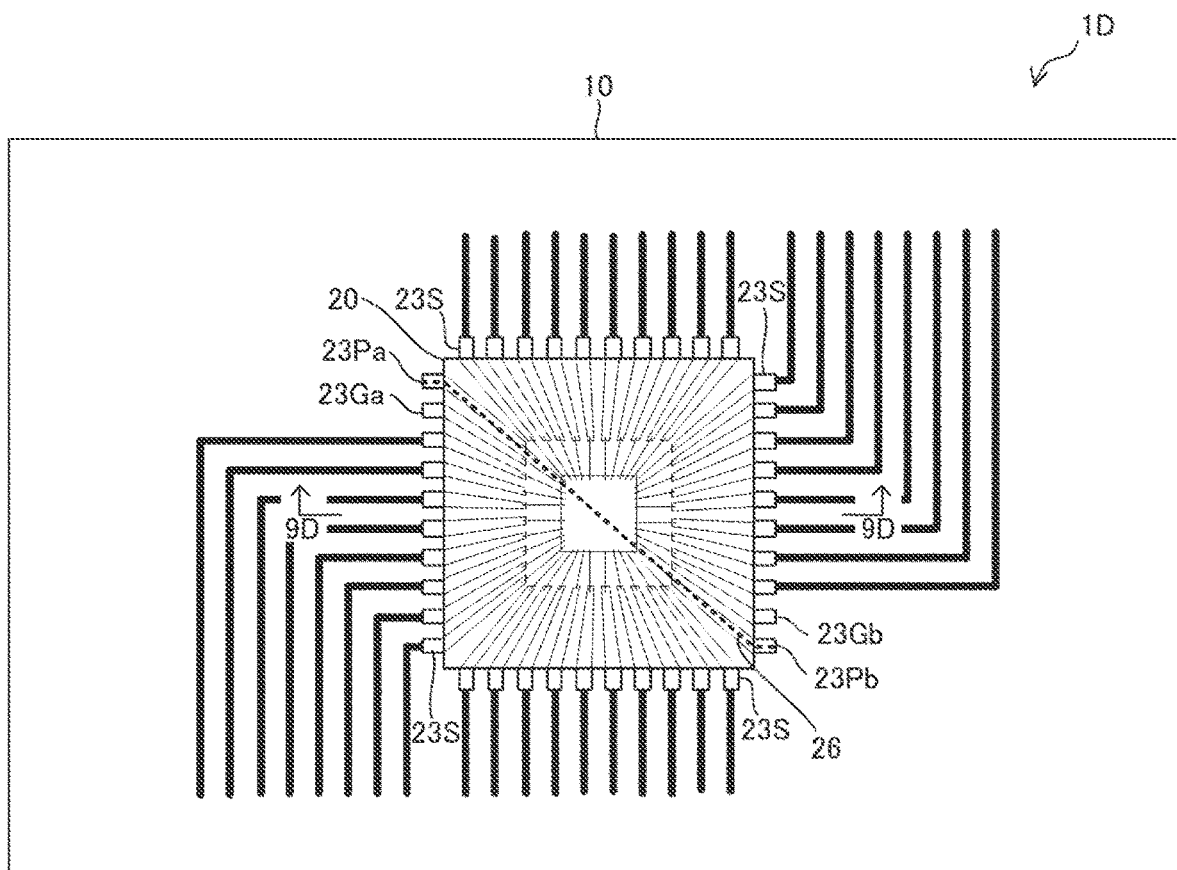
FIG. 9A is a plan view illustrating a configuration of an electronic device according to a fifth exemplary embodiment of the present disclosure.
Figure 9B:
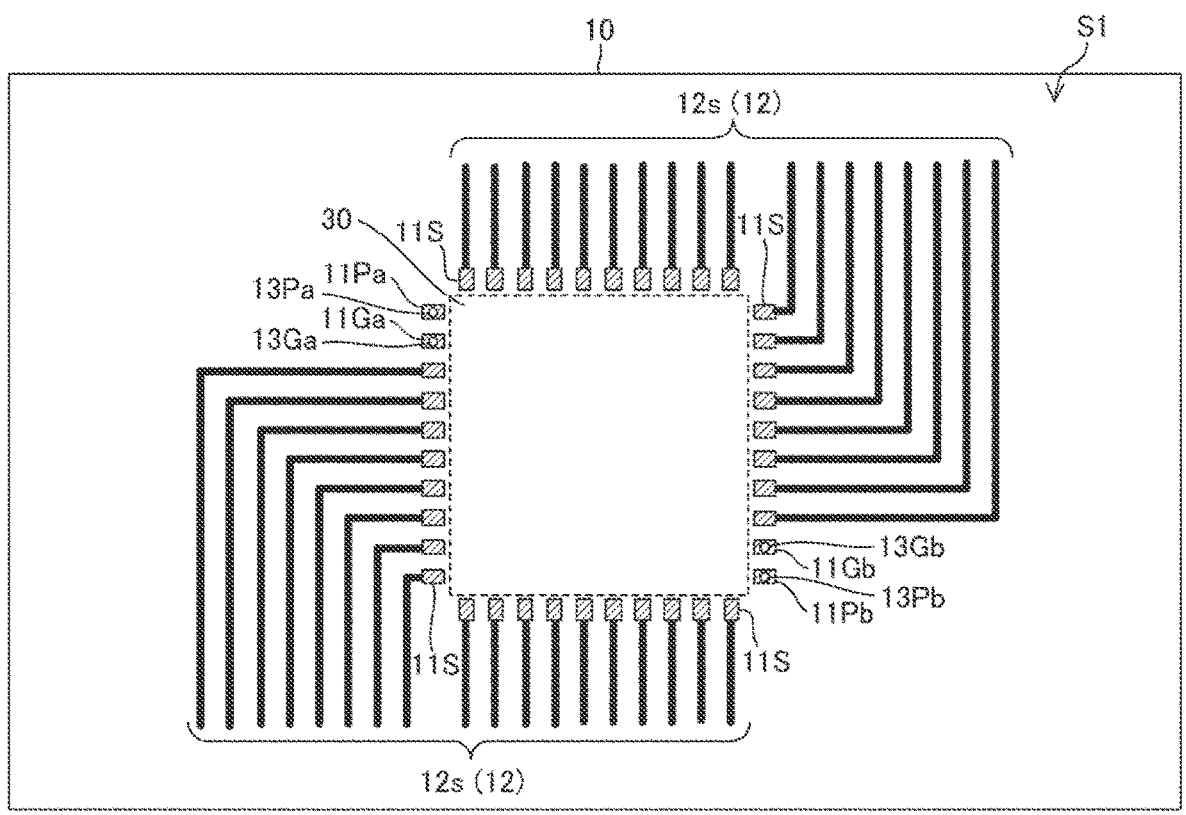
FIG. 9B is a plan view illustrating a wiring pattern formed on a first face of a wiring board according to an exemplary embodiment of the present disclosure.
Figure 9C:
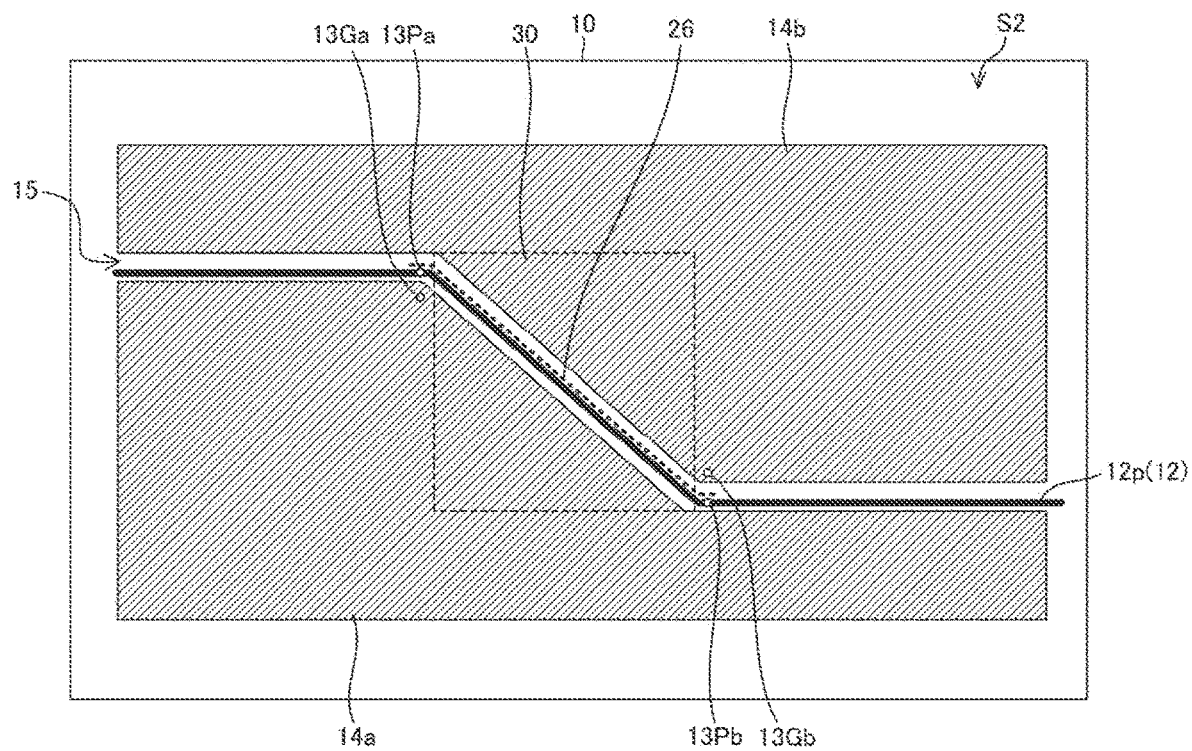
FIG. 9C is a plan view illustrating a wiring pattern formed on a second face of a wiring board according to an exemplary embodiment of the present disclosure.
Figure 9D:
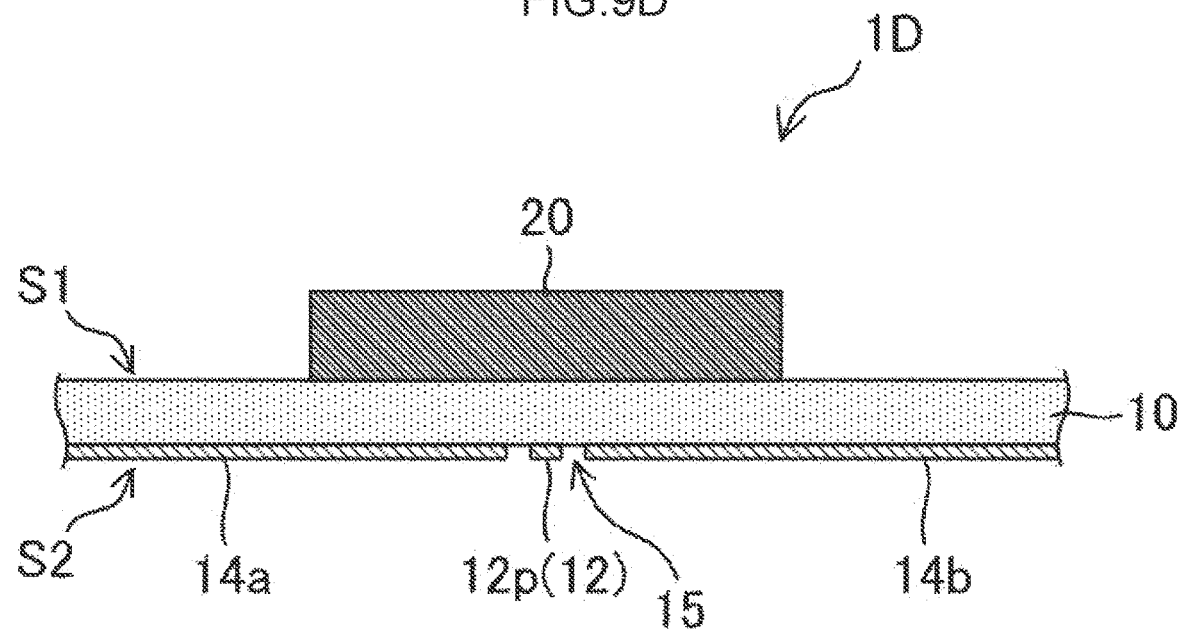
FIG. 9D is a cross-section taken along line 9D-9D in FIG. 9A.

FIG. 9A is a plan view illustrating an example of a configuration of an electronic device 1D according to a fifth exemplary embodiment of the present disclosure. The internal structure of the semiconductor device 20 is illustrated in FIG. 9A, with a conduction path 26 formed in the semiconductor device 20 illustrated in combination with a wiring pattern formed on the wiring board 10. FIG. 9B is a plan view illustrating an example of a wiring pattern formed on a first face Si of a wiring board 10 for mounting the semiconductor device 20. FIG. 9C is a plan view illustrating an example of a wiring pattern formed on a second face S2 on the opposite side of the wiring board 10 on the first face S1. FIG. 9D is a cross-section taken along line 9D-9D in FIG. 9A.

The semiconductor device 20 includes, in addition to power supply terminals 23Pa and 23Pb, ground terminals 23Ga, 23Gb and plural signal terminals 23S.

In addition to lands 11Pa and 11Pb at which the power supply terminals 23Pa and 23Pb are connected, the first face Si of the wiring board 10 is also provided with lands 11Ga and 11Gb at which the ground terminals 23Ga and 23Gb are respectively connected, and also plural lands 11S at which the signal terminals 23S are respectively connected. Moreover, plural signal wiring lines 12s connected to each of the lands 11S are also provided on the first face Si of the wiring board 10.

A power supply wiring line 12p is provided on the second face S2 of the wiring board 10. The signal wiring lines 12s and the power supply wiring line 12p are each respectively wiring lines configuring board wiring lines 12. The power supply wiring line 12p is connected via a through hole 13Pa to a land 11Pa provided on the first face Si of the wiring board 10. Moreover, the power supply wiring line 12p is connected via a through hole 13Pb to a land 11Pb provided on the first face S1 of the wiring board 10. The power supply wiring line 12p extends from the land 11Pa, via the inside of a mounting region 30, to the land 11Pb. The lands 11Pa and 11Pb are accordingly connected to each other by the power supply wiring line 12p, enabling a power supply voltage VDD of the same potential to be respectively supplied to the power supply terminals 23Pa and 23Pb of the semiconductor device 20.

Conductor patterns 14a, 14b are provided on the second face S2 of the wiring board 10 so as to be separated from each other by a gap 15. Most (for example not less than 70%) of a region containing the mounting region 30 on the second face S2 of the wiring board 10 is covered by the conductor patterns 14a, 14b. A ground potential is applied to the conductor patterns 14a and 14b. The conductor pattern 14a is connected via a through hole 13Ga to a land 11Ga provided on the first face Si of the wiring board 10. The conductor pattern 14b is connected via a through hole 13Gb to a land 11Gb provided on the first face S1 of the wiring board 10. The gap 15 isolating the conductor pattern 14a from the conductor pattern 14b extends so as to pass through the inside of a mounting region 30. The power supply wiring line 12p is arranged in the gap 15.

A portion of the power supply wiring line 12p passing through the inside of the mounting region 30 is arranged along the conduction path 26 formed in the semiconductor device 20. More specifically, a portion of the power supply wiring line 12p passing through the inside of the mounting region 30 is arranged directly below the conduction path 26 so as to be in superposition with the conduction path 26.

The electronic device 1D according to the fifth exemplary embodiment of the present disclosure enables the surface area of the inside region of a conduction loop 40 configured by the conduction path 26 formed in the semiconductor device 20 and the power supply wiring line 12p formed on the wiring board 10 to be essentially zero. Accordingly, the magnetic flux passing through the inside of the conduction loop 40 may be made essentially zero, and may further improve the tolerance to electromagnetic noise.

Moreover, most of a region containing the mounting region 30 on the second face S2 of the wiring board 10 is covered by the conductor patterns 14a and 14b that are applied with the ground potential. The conductor patterns 14a and 14b that are applied with the ground potential function as a shield to electromagnetic noise. This may further improve the tolerance to electromagnetic noise, due to most of the region containing the mounting region 30 on the second face S2 of the wiring board 10 being covered by the conductor patterns 14a and 14b.

Moreover, a ground terminal 23Ga of the semiconductor device 20 is connected via a through hole 13Ga to the conductor pattern 14a arranged directly below the ground terminal 23Ga, and a ground terminal 23Gb of the semiconductor device 20 is connected via a through hole 13Gb to the conductor pattern 14b arranged directly below the ground terminal 23Ga. This enables the ground terminals 23Ga and 23Gb to be connected by the shortest path to the ground potential.

Note that both the ground terminals 23Ga and 23Gb may be connected to a common conductor pattern 14a (or a common conductor pattern 14b). This may improve the tolerance to electromagnetic noise.

Sixth Exemplary Embodiment

Figure 10A:
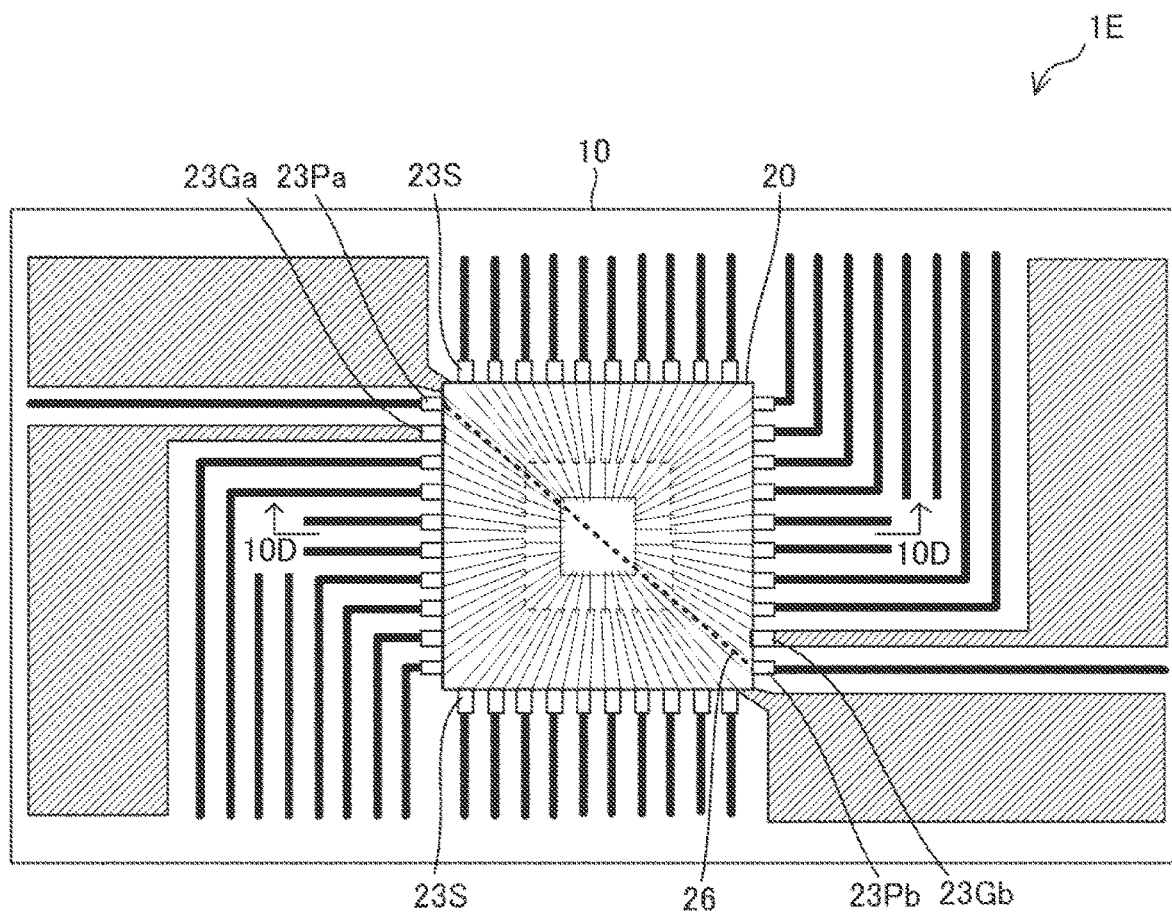
FIG. 10A is a plan view illustrating a configuration of an electronic device according to a sixth exemplary embodiment of the present disclosure.
Figure 10B:
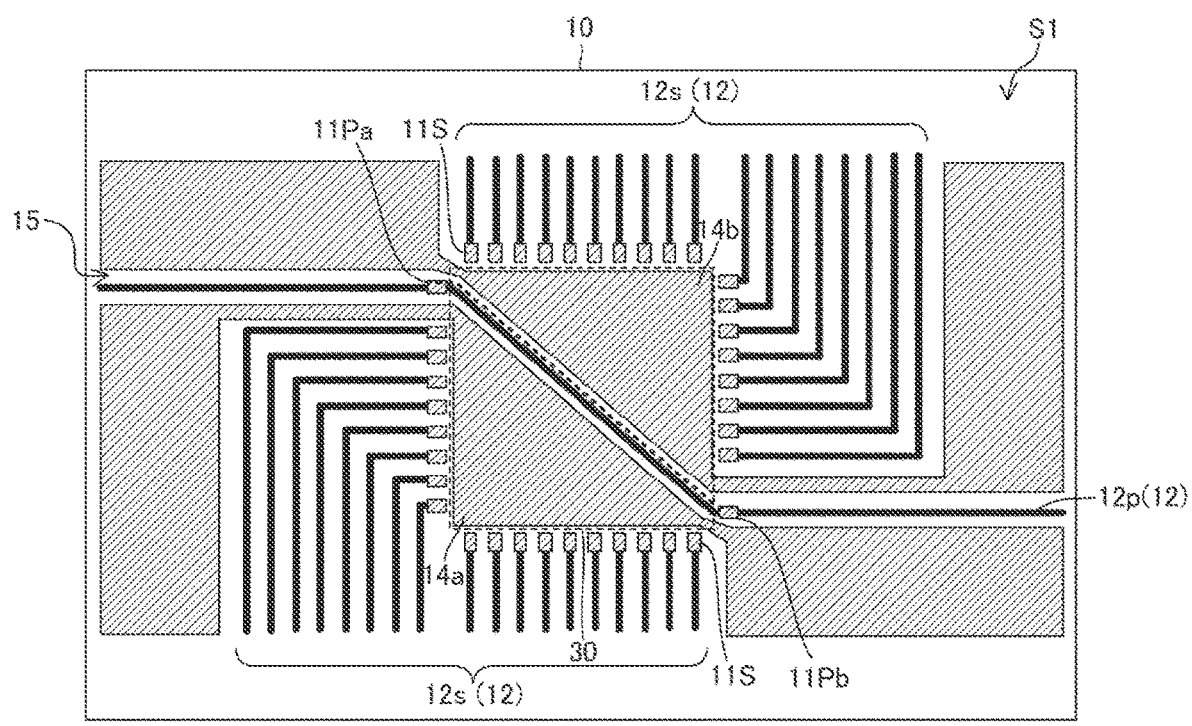
FIG. 10B is a plan view illustrating a wiring pattern formed on a first face of a wiring board according to an exemplary embodiment of the present disclosure.
Figure 10C:
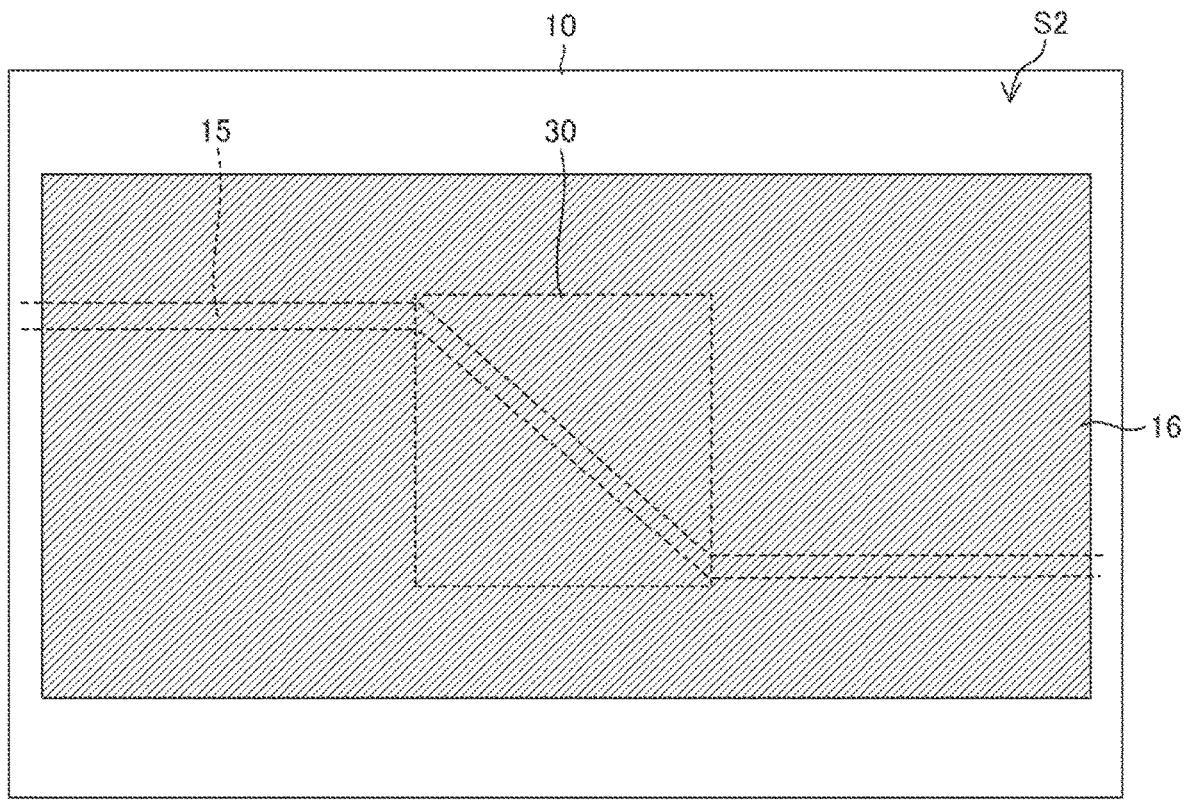
FIG. 10C is a plan view illustrating a wiring pattern formed on a second face of a wiring board according to an exemplary embodiment of the present disclosure.
Figure 10D:
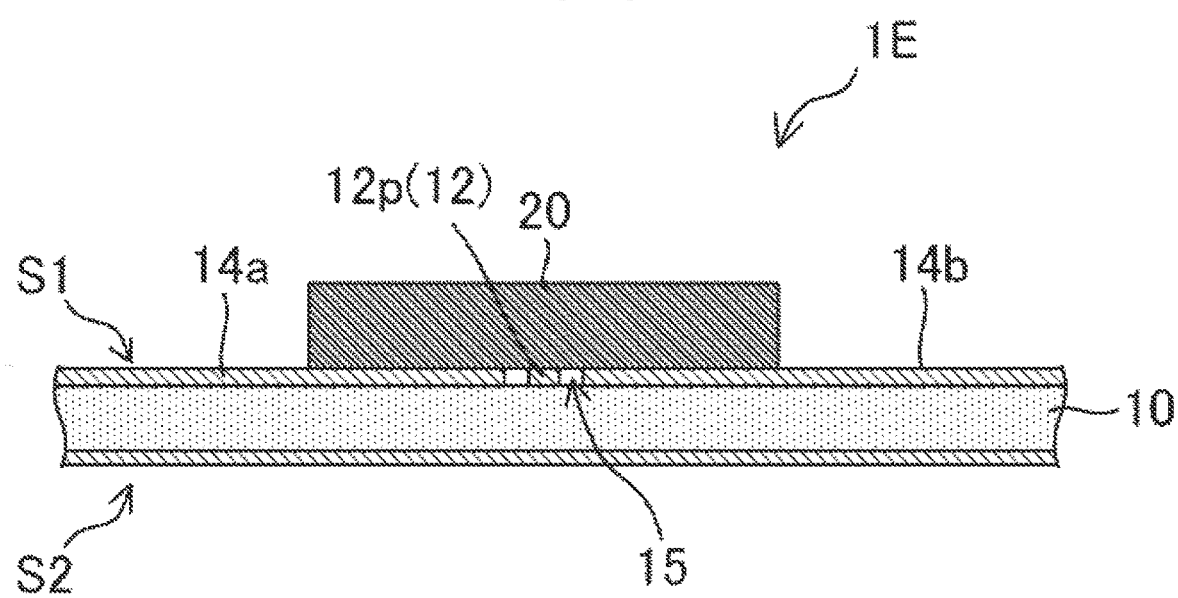
FIG. 10D is a cross-section taken along line 10D-10D in FIG. 10A.

FIG. 10A is a plan view illustrating an example of a configuration of an electronic device 1E according to a sixth exemplary embodiment of the present disclosure. The internal structure of a semiconductor device 20 is illustrated in FIG. 10A, with a conduction path 26 formed in the semiconductor device 20 illustrated in combination with a wiring pattern formed to a wiring board 10. FIG. 10B is a plan view illustrating an example of a wiring pattern formed on a first face 51 of a wiring board 10 to which the semiconductor device 20 is mounted. FIG. 10C is a plan view illustrating an example of a wiring pattern formed on a second face S2 on the opposite side of the wiring board 10 to the first face S1. FIG. 10D is a cross-section taken along line 10D-10D in FIG. 10A.

In addition to power supply terminals 23Pa and 23Pb, the semiconductor device 20 also includes ground terminals 23Ga, 23Gb and plural signal terminals 23S.

The first face S1 of the wiring board 10 is provided with lands 11Pa and 11Pb at which the power supply terminals 23Pa and 23Pb are connected, and plural lands 11S at which the signal terminals 23S are respectively connected. Plural signal wiring lines 12s respectively connected to the lands 11S are also provided on the first face S1 of the wiring board 10. A power supply wiring line 12p at which the lands 11Pa and 11Pb are connected is also provided on the first face S1 of the wiring board 10. The power supply wiring line 12p extends from the land 11Pa via the inside of a mounting region 30 to the land 11Pb. The lands 11Pa and 11Pb being connected to each other by the power supply wiring line 12p in this manner enables a power supply voltage VDD of the same potential to be respectively supplied to the power supply terminals 23Pa and 23Pb of the semiconductor device 20. The signal wiring lines 12s and the power supply wiring line 12p are each respective wiring lines configuring board wiring lines 12.

The first face S1 of the wiring board 10 is also provided with conductor patterns 14a and 14b at which the ground terminals 23Ga and 23Gb are respectively connected. The conductor patterns 14a and 14b are separated from each other by a gap 15. The conductor patterns 14a and 14b are members extending both inside and outside a mounting region 30 for the semiconductor device 20. Most (for example not less than 70%) of the mounting region 30 on the first face S1 of the wiring board 10 is covered by the conductor patterns 14a,14b. A ground potential is applied to the conductor patterns 14a and 14b. The gap 15 isolating the conductor pattern 14a from the conductor pattern 14b extends so as to pass through the inside of the mounting region 30. The power supply wiring line 12p is arranged in the gap 15.

A conductor pattern 16 is provided on the second face S2 of the wiring board 10. Most (for example not less than 70%) of a region containing the mounting region 30 on the second face S2 of the wiring board 10 is covered by the conductor pattern 16. The conductor pattern 16 is arranged in the mounting region 30 for the semiconductor device 20 so as to be in superposition with the gap 15 that isolates the conductor pattern 14a from the conductor pattern 14b. A ground potential is applied to the conductor pattern 16.

The portion of the power supply wiring line 12p passing through the inside of the mounting region 30 is arranged along a conduction path 26 formed in the semiconductor device 20. More specifically, a portion of the power supply wiring line 12p passing through the inside of the mounting region 30 is arranged directly below the conduction path 26 so as to be in superposition with the conduction path 26.

The electronic device 1E according to the sixth exemplary embodiment of the present disclosure may enable the surface area of the inside region of a conduction loop configured by the conduction path 26 formed in the semiconductor device 20 and the power supply wiring line 12p formed on the wiring board 10 to be essentially zero. Accordingly, the magnetic flux passing through the inside of the conduction loop 40 may be made essentially zero, and may further improve the tolerance to electromagnetic noise.

Most of the mounting region 30 on the first face Si of the wiring board 10 is covered by the conductor patterns 14a and 14b applied with the ground potential. The conductor patterns 14a and 14b applied with the ground potential function as a shield to electromagnetic noise. This may further improve the tolerance to electromagnetic noise due to most of the mounting region 30 on the first face Si of the wiring board 10 being covered by the conductor patterns 14a and 14b. There might be a concern here that the shielding effect would be diminished due to the gap 15 isolating the conductor pattern 14a from the conductor pattern 14b being arranged inside the mounting region 30. However, providing the conductor pattern 16 at positions on the second face S2 of the wiring board 10 in superposition with the gap 15 may suppress any diminishing of the shielding effect, due to the gap 15 being arranged inside the mounting region 30.

What is claimed is:

1. An electronic device, comprising:
    a semiconductor device including a plurality of terminals input with voltages having a same potential; and
    a wiring board including a mounting region at which the semiconductor device is mounted,
    wherein the wiring board includes a board wiring line from a connection portion at which one terminal of the plurality of terminals is connected, via an inside of the mounting region, to a connection portion at which another terminal of the plurality of terminals is connected,
    wherein the semiconductor device includes a conduction path connecting the plurality of terminals to each other, and
    wherein a portion of the board wiring line passing through the inside of the mounting region is disposed along at least a portion of the conduction path.

2. The electronic device of claim 1, wherein the semiconductor device includes a semiconductor chip, and a plurality of lead wires respectively connecting the semiconductor chip to the plurality of terminals, and
    the board wiring line is disposed along the conduction path in a region at which the plurality of lead wires are formed.

3. A wiring board, comprising:
a mounting region on which a semiconductor device is mounted, the semiconductor device including a plurality of terminals input with voltages having a same potential; and
a board wiring line on the wiring board from a connection portion at which one terminal of the plurality of terminals is connected, via an inside of the mounting region, to a connection portion at which another terminal of the plurality of terminals is connected,
wherein the semiconductor device includes a conduction path connecting the plurality of terminals to each other, and
wherein a portion of the board wiring line passing through the inside of the mounting region is disposed along at least a portion of the conduction path.

4. The wiring board of claim 3, wherein the semiconductor device includes a semiconductor chip, and a plurality of lead wires respectively connecting the semiconductor chip to the plurality of terminals, and
the board wiring line is disposed along the conduction path in a region at which the plurality of lead wires are formed.

* * * * *